United States Patent
Lo et al.

(10) Patent No.: US 11,762,302 B2
(45) Date of Patent: Sep. 19, 2023

(54) INTEGRATED CIRCUIT OVERLAY TEST PATTERNS AND METHOD THEREOF

(71) Applicant: Taiwan Semiconductor Manufacturing Co., Ltd., Hsinchu (TW)

(72) Inventors: Tseng Chin Lo, Hsinchu (TW); Bo-Sen Chang, Hsinchu (TW); Yueh-Yi Chen, Hsinchu (TW); Chih-Ting Sun, Hsinchu (TW); Ying-Jung Chen, Hsinchu (TW); Kung-Cheng Lin, Hsinchu (TW); Meng Lin Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 136 days.

(21) Appl. No.: 17/327,990

(22) Filed: May 24, 2021

(65) Prior Publication Data

US 2021/0278771 A1 Sep. 9, 2021

Related U.S. Application Data

(62) Division of application No. 16/008,267, filed on Jun. 14, 2018, now Pat. No. 11,016,398.

(51) Int. Cl.
| | |
|---|---|
| *H01L 21/66* | (2006.01) |
| *H01L 29/78* | (2006.01) |
| *G03F 7/20* | (2006.01) |
| *G03F 9/00* | (2006.01) |
| *G03F 7/00* | (2006.01) |

(52) U.S. Cl.
CPC ........ *G03F 7/70633* (2013.01); *G03F 9/7084* (2013.01); *H01L 22/12* (2013.01); *H01L 29/785* (2013.01)

(58) Field of Classification Search
CPC ...... G03F 7/70633; G03F 9/7084; G03F 1/44; H01L 22/12; H01L 29/785; H01L 22/30; H01L 21/68; H01L 22/24; H01L 22/34; H01L 23/544; H01L 2223/54426; G06F 30/392
USPC ........................................................ 438/14
See application file for complete search history.

(56) References Cited

U.S. PATENT DOCUMENTS

| | | |
|---|---|---|
| 8,796,666 B1 | 8/2014 | Huang et al. |
| 8,837,810 B2 | 9/2014 | Chen et al. |
| 9,093,530 B2 | 4/2015 | Huang et al. |
| 9,134,633 B2 | 9/2015 | Lin et al. |
| 9,230,867 B2 | 1/2016 | Cheng et al. |
| 9,304,403 B2 | 4/2016 | Lin et al. |
| 9,404,743 B2 | 8/2016 | Chiu et al. |
| 9,548,303 B2 | 1/2017 | Lee et al. |

(Continued)

*Primary Examiner* — Duy T Nguyen
(74) *Attorney, Agent, or Firm* — HAYNES AND BOONE, LLP

(57) ABSTRACT

Integrated circuits and methods for overlap measure are provided. In an embodiment, an integrated circuit includes a plurality of functional cells including at least one gap disposed adjacent to at least one functional cell of the plurality of functional cells and a first overlay test pattern cell disposed within the at least one gap, wherein the first overlay test pattern cell includes a first number of patterns disposed along a first direction at a first pitch. The first pitch is smaller than a smallest wavelength on a full spectrum of humanly visible lights.

20 Claims, 9 Drawing Sheets

(56) References Cited

U.S. PATENT DOCUMENTS

| | | | |
|---|---|---|---|
| 9,823,585 B2 | 11/2017 | Shih et al. | |
| 9,841,687 B2 | 12/2017 | Lee et al. | |
| 2006/0138464 A1* | 6/2006 | Shimamura | G06F 30/392 |
| | | | 257/E27.108 |
| 2008/0013824 A1* | 1/2008 | Yamaguchi | G06T 7/0004 |
| | | | 382/149 |
| 2010/0258798 A1* | 10/2010 | Sokel | H01L 22/34 |
| | | | 257/E27.001 |
| 2014/0183600 A1 | 7/2014 | Huang et al. | |
| 2015/0115329 A1 | 4/2015 | Lin et al. | |
| 2015/0377958 A1* | 12/2015 | Ukraintsev | G01Q 30/02 |
| | | | 324/750.18 |
| 2016/0190116 A1* | 6/2016 | Tsai | G03F 1/36 |
| | | | 430/5 |
| 2018/0006010 A1 | 1/2018 | Lo et al. | |
| 2019/0012423 A1* | 1/2019 | Lee | G06F 30/398 |

\* cited by examiner

INTEGRATED CIRCUIT OVERLAY TEST PATTERNS AND METHOD THEREOF

PRIORITY DATA

This application is a divisional application of U.S. patent application Ser. No. 16/008,267, filed Jun. 14, 2018 and issued as U.S. Pat. No. 11,016,398 on May 25, 2021, the entirety of which is hereby incorporated by reference.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

In particular, inaccurate overlay among different layers of semiconductor devices has become a critical issue in the scaling down process. As inaccurate overlay can cause contact failures, it can lead to high defect rate or inferior quality in the resulting IC devices. Box-in-Box or micro-diffraction-based-overlay (μDBO) is among the existing techniques to measure overlay. Because these techniques utilize visible lights, their overlay patterns have dimensions that are comparable to visible-light wavelengths and therefore larger than state-of-the-art functional circuit blocks. To preserve precious real estate on a semiconductor wafer, the number and locational distribution of Box-in-Box and μDBO overlay patterns on a wafer can be less than optimal. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
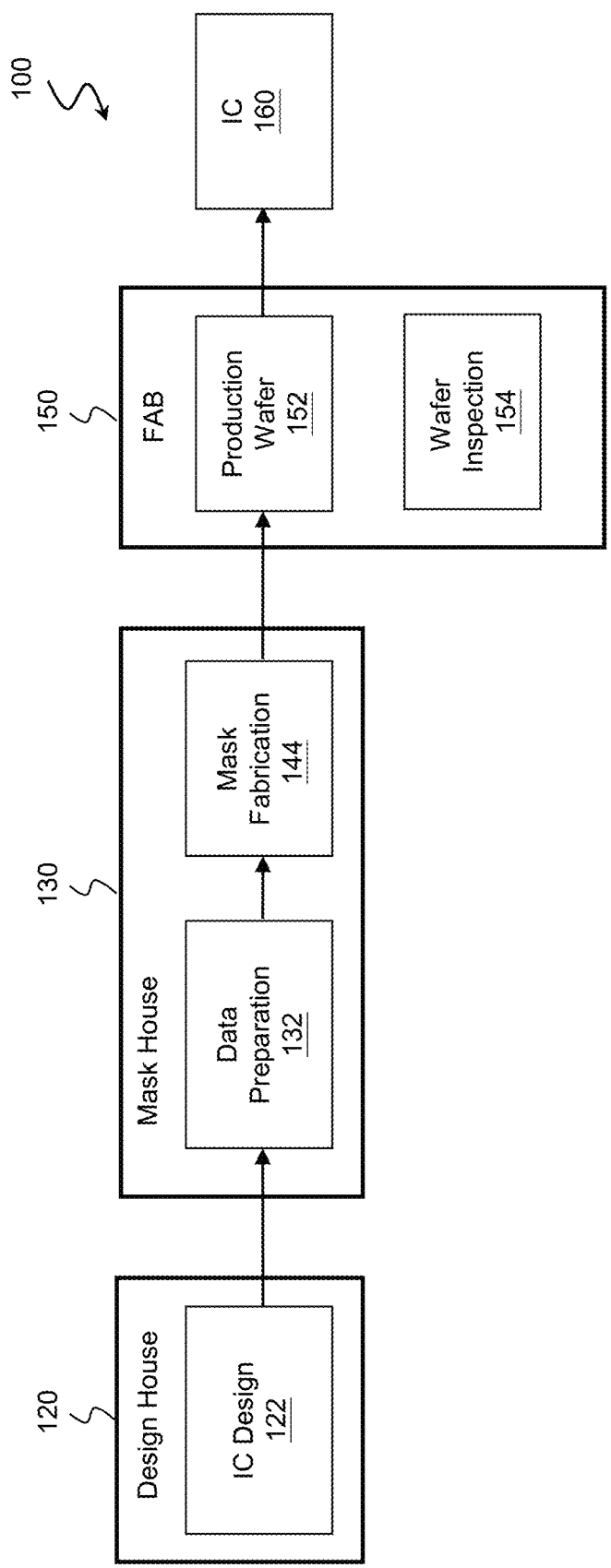
FIG. 1 is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

It is also noted that the embodiments described herein may be employed in the design and/or fabrication of any type of integrated circuit, or portion thereof, which may comprise any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, FinFET devices, gate-all-around (GAA) devices, Omega-gate (Ω-gate)

devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, other memory cells, or other devices as known in the art. One of ordinary skill may recognize other embodiments of semiconductor devices and/or circuits, including the design and fabrication thereof, which may benefit from aspects of the present disclosure.

The present disclosure is generally related to a method of accurately measuring overlay among different layers of IC devices by employing overlay test patterns in a circuit layout. Thus, additional embodiments may include an integrated circuit including the overlay test patterns. Specifically, embodiments of the present disclosure provide insertion of an overlay test pattern cell not only in scribe lines, but also into a gap among functional cell blocks or standard cell blocks, as a replacement for a standard filler cell, or as a replacement for a dummy cell. Embodiments of the present disclosure also provide inspection of overlay test pattern cells, after their fabrication on a substrate, using e-beam inspection techniques. In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (e.g., such as a NAND gate). Cell-based methodology—the general class to which standard cells belong—makes it possible for one designer to focus on the high-level (logical function) aspect of digital design, while another designer focuses on the implementation (physical) aspect. Along with semiconductor manufacturing advances, standard cell methodology has helped designers scale ASICs from comparatively simple single-function ICs (of several thousand gates), to complex multi-million gate system-on-a-chip (SoC) devices.

By way of example, a standard cell (e.g., which may be referred to as a functional cell and/or functional logic cell) is a group of transistor and interconnect structures that provides a Boolean logic function (e.g., AND, OR, XOR, XNOR, inverters) or a storage function (flip-flop or latch). The simplest cells are direct representations of the elemental NAND, NOR, and XOR Boolean function, although cells of much greater complexity are commonly used (e.g., such as a 2-bit full-adder, or mixed D-input flip-flop).

In a standard cell layout of an integrated circuit, gaps may be created between standard cells or standard cell blocks, as it may not be possible to have 100% utilization of the layout and also due to routing congestion. Such gaps may be filled for a number of reasons, such as for N-well continuity, to improve feature uniformity across a wafer, to ensure that power and ground signals are coupled to other functional cells, to reduce issues related to semiconductor yield, as well as for a variety of other reasons. In various cases, the gaps described above may be filled using standard filler cells, which may include non-functional filler cells. As described in more detail herein, embodiments of the present disclosure are directed to a method of accurate, high-throughput overlay measurement by employing an overlay test pattern cell in a circuit layout and e-beam inspection to provide sufficient, accurate overlay data for overlay improvement. Additionally, because the method of overlay measurement described in the present disclosure is performed inline or by measurement tools installed in the production line, the measurement results can be obtained after a substrate (e.g. a wafer) is processed.

E-beam inspection has gained considerable interest in recent years, particularly due to its ability to detect smaller features (such as defects) than those which can be detected using optical inspection. For example, e-beam inspection may provide detection of features down to about 3 nanometers (nm), whereas optical inspection may begin to have trouble finding features smaller than 30 nm. E-beam inspection may also be used to generate voltage-contrast images based on electrical shorts or opens at a contact or an interconnect void. Embodiments of the present disclosure take advantages of the e-beam's ability to detect smaller features and generate voltage contrast images and employ overlay test pattern cells with patterns outside the detection range of existing techniques. As a result, embodiments of the present disclosure offer advantages over existing art, though it is understood that other embodiments may offer different advantages, not all advantages are necessarily discussed herein, and no particular advantage is required for all embodiments. For example, at least some embodiments provide insertion of an overlay test pattern cell into a gap among functional cell blocks or standard cell blocks, as a replacement for a standard filler cell, or as a replacement for a dummy cell. Embodiments of the present disclosure also provide inspection of overlay test pattern cells, after their fabrication on a substrate, using e-beam inspection techniques. In some examples, the standard filler cells may be replaced by the overlay test pattern cells at an auto-place and route (APR) stage of a design flow. For example, at least some advantages include no additional cost in terms of chip utilization, more accurate overlay measure results, higher overlay measure data output, and increased throughput. Thus, embodiments of the present disclosure provide an enhanced overlay measure methodology. It is understood that the disclosed advantages are merely exemplary, and additional advantages may be evident to those skilled in the art having benefit of this disclosure.

Referring now to FIG. 1, illustrated therein is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. Additionally, the IC design layout 122 may include overlay test pattern cells, in accordance with embodiments of the present disclosure. In various examples, the design house 120 implements a design procedure to form the IC design layout 122. The design procedure may include logic design, physical design, and/or placement and routing. Additional details of the design house 120 design procedure and the IC design layout 122, including the insertion of the overlay test pattern cells, are described in more detail below. The IC design layout 122 may be presented in one or more data files having information related to the geometrical patterns which are to be used for fabrication of the IC device 160. In some examples, the IC design layout 122 may be expressed in a GDSII file format or DFII file format.

In some embodiments, the design house 120 may transmit the IC design layout 122 to the mask house 130, for example, via the network connection described above. The mask house 130 may then use the IC design layout 122 to manufacture one or more masks, which include the overlay test pattern cells, to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes as known in the art. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof.

After mask data preparation 132 and during mask fabrication 144, a mask or a group of masks may be fabricated based on the IC design layout 122 which includes the overlay test pattern cells. For example, an electron-beam (e-beam) or a mechanism of multiple e-beams is used to form a pattern on a mask (photomask or reticle) based on the IC design layout 122 including the overlay test pattern cells. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns, including an overlay test pattern cell, onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business (e.g., research and development). In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps).

In some instances, the design house 120 may transmit the IC design layout 122 to the IC manufacturer 150 before the mask house 130 perform mask preparation. In these instance, the IC manufacturer 150 reviews the IC design layout 122 and inserts non-functional filler cells and/or dummy cells in gaps and dummy insertion areas in the IC design layout 122 to compensate for potential lithography errors that may arise in the IC fabrication process, such as those that can arise from device density loading effect, or other process effects. In some instances, the IC manufacturer 150 can also replace some the filler cells or dummy cells with overlay test pattern cells.

Moreover, the mask (or masks) may be used in a variety of processes. For example, the mask (or masks) may be used to pattern various layers, in an ion implantation process to form various doped regions in the semiconductor wafer, in an etching process to form various etching regions in the semiconductor wafer, and/or in other suitable processes. As such, the overlay test pattern cell may be transferred onto any of a plurality of layers (e.g., metal, insulator, etc.) of the production wafer 152 during the manufacturing process. In addition, a wafer inspection 154 facility (e.g., such as an e-beam inspection facility) of the IC manufacturer 150 may be used to inspect the production wafer 152 during various stages of processing, for example, to measure and monitor overlay among different layers of the IC. By way of example, if the wafer inspection 154 identifies substantial overlay misalignment, the wafer inspection 154 may analyze the overlay measurement data or have a different department to analyze the overlay measurement data. The result of the analysis can serve the purposes of improving the overlay of upcoming lots of production wafers. In some implementations, if the wafer inspection 154 determines that the overlay misalignment of the production wafer 152 exceeds a preset quality control threshold, the wafer inspection 154 can mark the production wafer 152 for quality control review as the misalignment between layers can lead to defects in a large area of the production wafer 152. In some instances, if the wafer inspection 154 determines that the overlay misalignment on the production wafer 152 exceeds a preset scrap threshold, the wafer inspection 154 may scrap the production wafer 152, remove the defective area on the production wafer, order the production wafer 152 be reprocessed, or order other appropriate processing be performed. In accordance with embodiments of the present disclosure, use of the overlay test pattern cells provides for improved overlay measurement accuracy and increased data throughput. Thus, embodiments of the present disclosure provide a design of overlay test pattern cells and a novel method to measure overlay using e-beam inspection, thereby improving the overlay measurement accuracy of the wafer inspection 154 facility.

Figure 2:
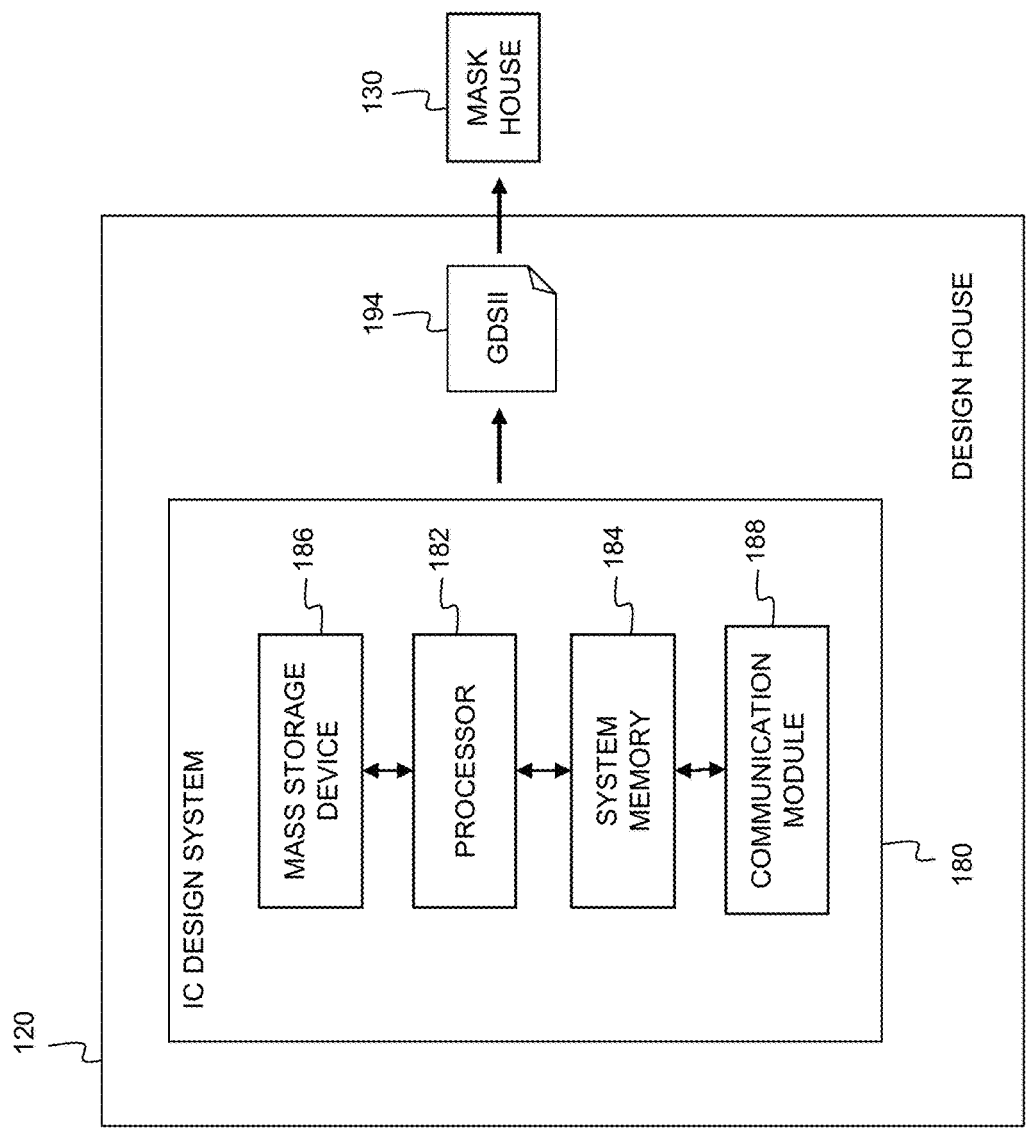
FIG. 2 is a more detailed block diagram of the design house shown in FIG. 1 according to various aspects of the present disclosure.

Referring now to FIG. 2, provided therein is a more detailed block diagram of the design house 120 shown in FIG. 1 according to various aspects of the present disclosure. In the example of FIG. 2, the design house 120 includes an IC design system 180 that is operable to perform the functionality described in association with the design house 120 of FIG. 1 and in association with methods 300, 321, 322, and 323 of FIGS. 3, 4A, 4B, and 4C, discussed below. The IC design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored within the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as mask house 130. Examples of communication modules may include Ethernet cards, 802.11 WiFi devices, cellular data radios, and/or other suitable devices known in the art.

In operation, the IC design system 180 is configured to provide the IC design layout 122, including the overlay test pattern cell. In such an embodiment, the IC design system 180 provides the IC design layout 122, which may be in the form of a GDSII file 194 and which includes the overlay test pattern cell, to the mask house 130. As such, the mask house 130 may use the provided IC design layout to manufacture one or more masks, which include the overlay test pattern cell. In alternative embodiments, the IC design layout 122 may be transmitted between the components in the IC manufacturing system 100 in alternate file formats such as DFII, CIF, OASIS, or any other suitable file type. Further, the IC design system 180, the IC design house 120, and the mask house 130 may include additional and/or different components in alternative embodiments.

Figure 3:
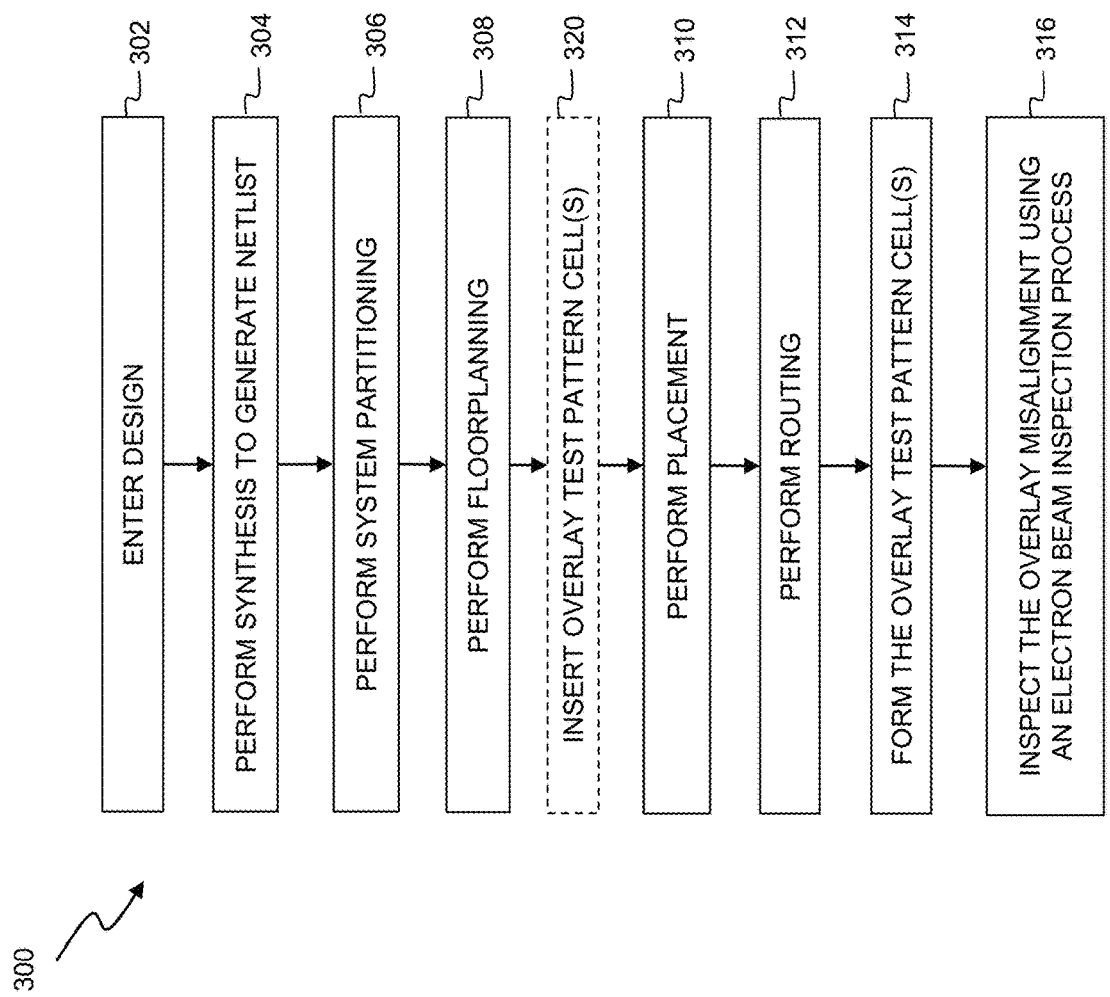
FIG. 3 shows a high-level flowchart of a method 300 of a generalized design flow followed by pattern fabrication and inspection, according to various aspects of the present disclosure.

Referring now to FIG. 3, illustrated therein is a flow chart of a method 300 that may be implemented by the design house 120 and the IC manufacturer 150 to provide the IC design layout 122, insert overlay test pattern cells, form the overlay test pattern cells, and inspect the overlay misalignment, in accordance with various embodiments. By way of example, the method 300 includes a generalized physical design flow and/or ASIC design flow. The method 300 begins at block 302 where a design is entered, for example, by way of a hardware description language (e.g., VHDL, Verilog, and/or SystemVerilog). The design entered using the hardware description language may be referred to as register transfer level (RTL) design. In some cases, functional/logical verification may be performed after the RTL design. The method 300 then proceeds to block 304 where synthesis is performed to generate a netlist (e.g., a gate-level netlist). In some examples, a synthesis tool takes the RTL hardware description and a standard cell library as inputs and generates a gate-level netlist as an output. The method proceeds to block 306 where partitioning is performed, for example, to separate various functional blocks. Thereafter, the method proceeds to block 308 where floorplanning is performed. By way of example, floorplanning is the process of identifying structures that should be placed close together, and allocating space for them in such a manner as to meet the sometimes conflicting goals of available space, required performance, and the desire to have various structures close to one another. Merely for purposes of illustration, the method 300 shows that the insertion of overlay test pattern cells (block 320) may be performed immediately following the floorplanning step (block 308). To be sure, and as discussed herein, insertion of the overlay test pattern cells (block 320) may be performed any time between the floorplanning step (block 308) and the formation of the overlap test pattern cell (block 314) and may be performed by the design house 120, the mask house 130, or the IC manufacturer 150. For example, insertion of the overlay test pattern cells (block 320) may be performed after routing (block 312) but before forming the overlay test pattern cells (block 314), or alternative, after placement (block 310) but before routing (block 312). As such, the block 320 of the method 300 is illustrated using a dashed line. In addition, as will be described in more detail below in conjunction with FIGS. 4A, 4B and 4C, the overlay test pattern cells can be inserted pursuant to exemplary methods 321, 322 and 323. The method 300 may then proceed to block 310 where placement is performed. Placement may be used to assign locations to various circuit components on a chip. In various examples, placement may aim to optimize a total wirelength, timing, congestion, power, as well as to accomplish other objectives. The method may then proceed to block 312 where routing is performed. Routing is used to add wiring (e.g., electrical connections) between the previously placed components while satisfying IC design rules. Thereafter, the method 300 proceeds to block 314 where the overlay test pattern cells are formed (i.e. fabricated) by the IC manufacturer 150. As used herein, the overlay test pattern cells are formed or fabricated when a photoresist layer over a material layer is patterned by lithography processes to form an etch mask and the material layer is etched using the etch mask to form the overlay test pattern cells. Any inspection, such as e-beam inspections, to be performed from this point forward is considered after-etching-inspection or "AEI" for short. The method may then proceed to block 316 where the overlay test pattern cells are subject to inspection and measurement using e-beam inspection. Additional operations can be provided before, during, and after the method 300, and some operations described can be replaced, eliminated, or moved around for additional embodiments of the method. For example, the method 300 may also include clock-tree synthesis, physical verification, timing analysis, GDSII generation, or other suitable steps. It is also noted that the method 300 is exemplary, and is not intended to limit the present disclosure beyond what is explicitly recited in the claims that follow.

As previously described, gaps may be created between standard cells (or standard cell blocks if more than one standard cells can be integrated into a block) of an IC design layout (e.g., the IC design layout 122), as it may not be possible to have 100% utilization of the layout and also due to routing congestion. In at least some existing methods, a non-used or standard filler cell may be used to fill in these gaps. In embodiments of the present disclosure, such standard filler cells may be replaced by an overlay test pattern cell, to be used for overlay measurement after it is fabricated over or below a different overlay test pattern cell. In various embodiments, an overlay test pattern cell includes an array of patterns that are either disposed at a uniform pitch or have increasing spacing from a center pattern of the array. In some embodiments, the overlay test pattern cells are inserted after the floor planning step (block 308) and before the placement step (block 310). Alternatively, the overlay test pattern cells can be inserted as part of the placement step (block 310). In some instances, the overlay test pattern cells can be inserted after the placement step (block 310). If the overlay test pattern cells are inserted before any standard filler cells are placed, the overlay test pattern cells can be inserted directly into gaps among standard functional cells. If the overlay test pattern cells are inserted after any standard filler cells are placed in gaps among standard functional cells, the standard filler cells are replaced by overlay test pattern cells. In instances where dummy cells have already been placed in dummy insertion areas in the layout, some dummy cells can be removed and replaced by overlay test pattern cells. Generally, as previously discussed, insertion of the overlay test pattern cells (block 320) may be performed any time between the floorplanning step (block 308) and the formation of the overlap test pattern cell (block 314) and may be performed by the design house 120, the mask house 130, or the IC manufacturer 150. Regardless of when the overlay test pattern cells are inserted into the IC layout design, the present disclosure provides one or more methods for such insertion, as described in more detail below.

Figures 4A, 4B, 4C:
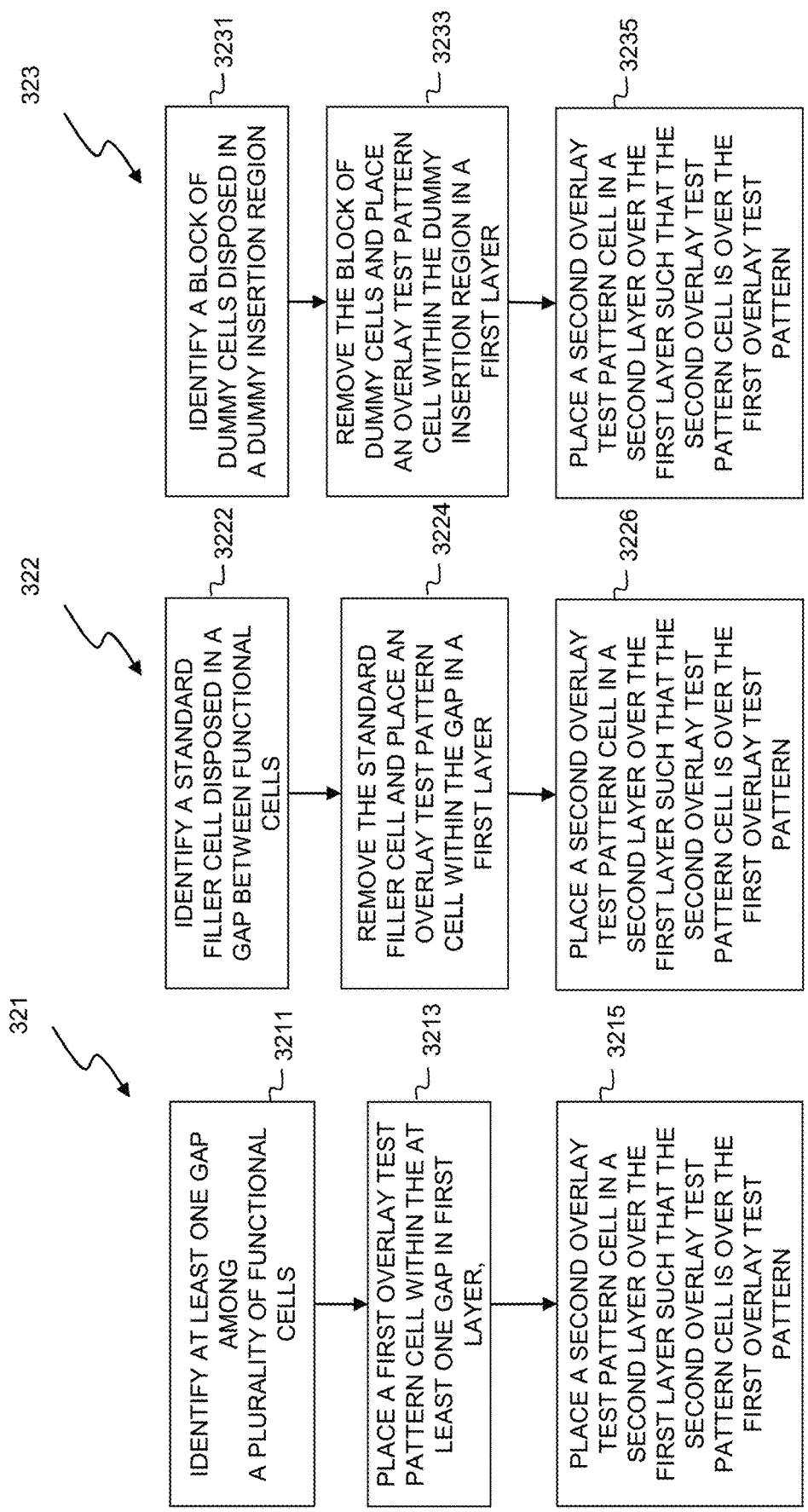
FIGS. 4A, 4B and 4C illustrate flowcharts of methods as exemplary embodiments for inserting overlay test pattern cells into an IC layout in accordance with various embodiments.

In particular, and with reference to FIGS. 4A, 4B and 4C, illustrated therein are exemplary methods 321, 322 and 323, respectively, for inserting an overlay test pattern cell in accordance with various embodiments. By way of example, the method 321 provides a method for inserting the overlay test pattern cell at a stage of the physical design flow (e.g., the method 300) when no standard filler cells have been placed; the method 322 provides a method for inserting the overlay test pattern cell at a stage after standard filler cells have been placed; and the method 323 provides a method for inserting the overlay test pattern cell at a stage after dummy cells have been placed in identified dummy insertion areas. Additional operations can be provided before, during, and after the methods 321, 322 and 323, and some operations described can be replaced, eliminated, or moved around for additional embodiments of the method. It is also noted that the methods 321, 322 and 323 are exemplary, and are not intended to limit the present disclosure beyond what is explicitly recited in the claims that follow. Various aspects of the methods 321, 322 and 323 are described below with reference to FIGS. 5A, 5B and 6.

Figure 5A:
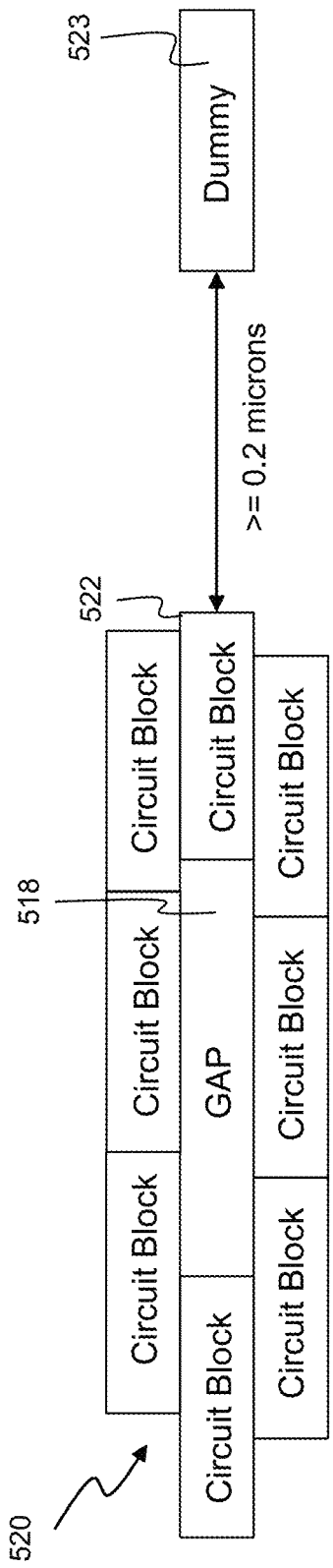
FIGS. 5A and 5B illustrate portions of an IC layout, demonstrating insertion of the overlay test pattern cells into the IC layout, in accordance with some embodiments.

Beginning with the method 321 shown in FIG. 4A, the method 321 begins at block 3211 where at least one gap is identified among a plurality of functional cells. Referring to the example of FIG. 5A, a portion of IC layout 520 is shown which includes a plurality of standard cells 522 labeled 'Circuit Block', and a gap 518 labeled 'GAP' disposed among and/or between the standard cells 522. As previously noted, the standard cells 522, which may be referred to as a functional cell and/or functional logic cell, may include a group of transistor and interconnect structures that can provide any of a number of simple to complex circuit functions. Stated another way, the standard cells 522 may be referred to as portions of a circuit of the IC layout 520. Gaps, such as the gap 518 shown in FIG. 5A, may occur because it may not be possible to have 100% utilization of the layout and also due to routing congestion. FIG. 5A also illustrates a dummy cell 523 or a block of dummy cells 523 filled in a dummy insertion area that is identified or determined in the IC design flow, such as after the placement step (block 310 in FIG. 3) or after the routing step (block 312 in FIG. 3). In at least some embodiments, a spacing between the dummy cell 523 and a dummy insertion area is greater than or equal to about 0.2 microns.

The method 321 proceeds to block 3213 where an overlay test pattern cell is placed within the at least one gap 518 identified at block 3211. The overlay test pattern cell includes an array of patterns with known pitches or spacing. As previously discussed, it is desirable to fill the identified at least one gap 518 for a number of reasons, such as for N-well continuity, to improve feature uniformity across a wafer, to ensure that power and ground signals are coupled to other functional cells, to reduce issues related to semiconductor yield, as well as for a variety of other reasons. In at least some conventional methods, such gaps may be filled using standard filler cells, such as the standard filler cell 526, which may include non-functional filler cells. However, in accordance with embodiments of the present disclosure, an overlay test pattern cell 524 is placed within the at least one gap 518 at block 3213 instead of a standard filler cell 526. To be sure, in some embodiments, a combination of one or more overlay test pattern cells 524 and one or more standard filler cells 526 may be placed within one or more gaps of the IC layout. In some embodiments, the overlay test pattern cell 524 inserted at block 3213 of the method 321 may be referred to as the first overlay test pattern cell 524 and they are inserted into a first layer of the IC design layout. At block 3215 of the method 321, a second overlay test pattern cell (not shown) is placed or inserted in a second layer over the first layer such that the second overlay test pattern cell is over the first overlay test pattern cell. In some embodiments, while the first overlay test pattern cell in the first layer and the second overlay test pattern cell are both an array of patterns, their patterns are different in terms of pitches, spacing and widths.

In addition, the various embodiments disclosed herein, including the methods 300 (except for block 314 and 316), 321, 322, and 323, may be implemented on any suitable computing system, such as the IC design system 180 described in association with FIG. 2. In some embodiments, these methods may be executed on a single computer, local area networks, client-server networks, wide area networks, internets, hand-held and other portable and wireless devices and networks. Such a system architecture may take the form of an entirely hardware embodiment, an entirely software embodiment, or an embodiment containing both hardware and software elements. By way of example, hardware generally includes at least processor-capable platforms, such as client-machines (also known as personal computers or servers), and hand-held processing devices (such as smart phones, personal digital assistants (PDAs), or personal computing devices (PCDs), for example. In addition, hardware may include any physical device that is capable of storing machine-readable instructions, such as memory or other data storage devices. Other forms of hardware include hardware sub-systems, including transfer devices such as modems, modem cards, ports, and port cards, for example. In various examples, software generally includes any machine code stored in any memory medium, such as RAM or ROM, and machine code stored on other devices (such as floppy disks, flash memory, or a CD-ROM, for example). In some embodiments, software may include source or object code, for example. In addition, software may encompass any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium may be any apparatus that can contain, store, communicate, propagate, or transport the program for use by or in connection with the instruction execution system, apparatus, or device. The medium may be an electronic, magnetic, optical, electromagnetic, infrared, a semiconductor system (or apparatus or device), or a propagation medium.

In some embodiments, defined organizations of data known as data structures may be provided to enable one or more embodiments of the present disclosure. For example, a data structure may provide an organization of data, or an organization of executable code. In some examples, data signals may be carried across one or more transmission media and store and transport various data structures, and may thus be used to transport an embodiment of the present disclosure.

Figure 5B:
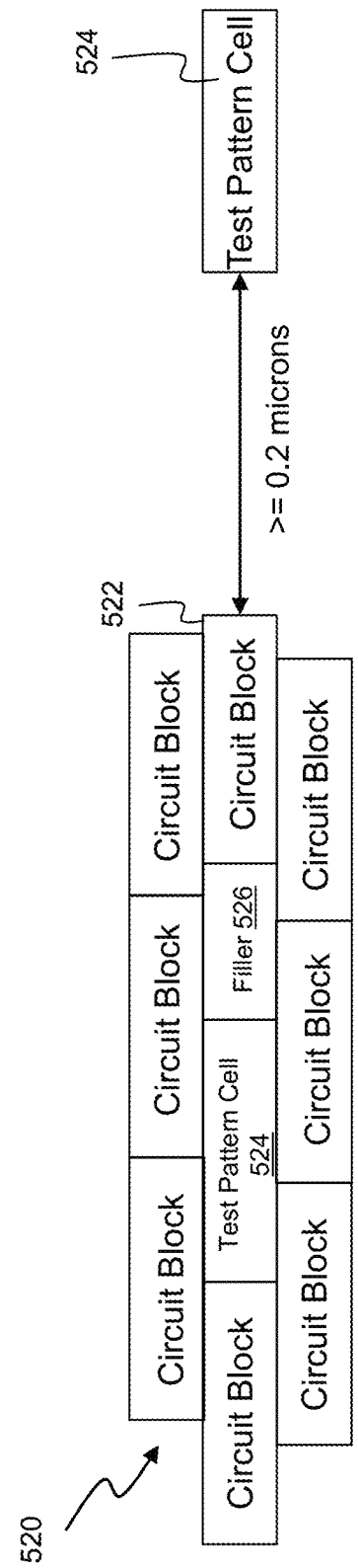

Referring to the example of FIGS. 5A and 5B and the method 322 in FIG. 4B, in block 3222, a standard filler cell 526 out of the standard filler cells placed in the gap 518 is identified. At block 3224, the identified standard filler cell is removed and replaced with an overlay test pattern cell 524, resulting in the overlay test pattern cell 524 placed adjacent to a standard filler cell 526 within the gap, which is labeled 'GAP' in FIG. 5A. While the overlay test pattern cell 524 is illustrated as being larger in size than the standard filler cell 526, the sizes shown are not meant to be limiting in any way. In some examples, the overlay test pattern cell 524 is larger than the standard filler cell 526. In some cases, the standard filler cell 526 is not used and the entire gap 518 is filled with overlay test pattern cells such as the overlay test pattern cell 524. Thus, in some examples, the gap may be filled entirely with a plurality of overlay test pattern cells 524, which may be the same or different overlay test pattern cells, for example, arranged for overlay measurement along different directions. At block 3226 of the method 322, a second overlay test pattern cell (not shown) is placed or inserted in a second layer over the first layer such that the second overlay test pattern cell is over the first overlay test pattern cell. In some embodiments, while the first overlay test pattern cell in the first layer and the second overlay test pattern cell in the second layer are both an array of patterns, their patterns are different in terms of pitches, spacing and widths.

Referring to the example of FIGS. 5A and 5B and the method 323 in FIG. 4C, in block 3231, a dummy cell 523 or a block of dummy cells 523 out of multiple dummy cells placed in a dummy insertion area is identified. At block 3233, the identified dummy cell 523 or block of dummy cells 523 is removed and replaced with an overlay test pattern cell 524 as shown in FIG. 5B. While the overlay test pattern cell 524 is illustrated as being comparable in size to the dummy cell 523 or block of dummy cells, the sizes shown are not meant to be limiting in any way. In some examples, the overlay test pattern cell 524 is larger than the dummy cell 523 or block of dummy cells 523. In some cases, the dummy cell 523 or block of dummy cells 523 is not used and the dummy insertion area is filled with overlay test pattern cells such as the overlay test pattern cell 524. In some examples, the dummy insertion area may be partially filled with a plurality of overlay test pattern cells which may be the same or different overlay test pattern cells, for example, arranged for overlay measurement along different directions. At block 3235 of the method 323, a second overlay test pattern cell (not shown) is placed or inserted in a second layer over the first layer such that the second overlay test pattern cell is over the first overlay test pattern cell. In some embodiments, while the first overlay test pattern cell in the first layer and the second overlay test pattern cell in the second layer are both an array of patterns, their patterns are different in terms of pitches, spacing and widths.

Figure 6:
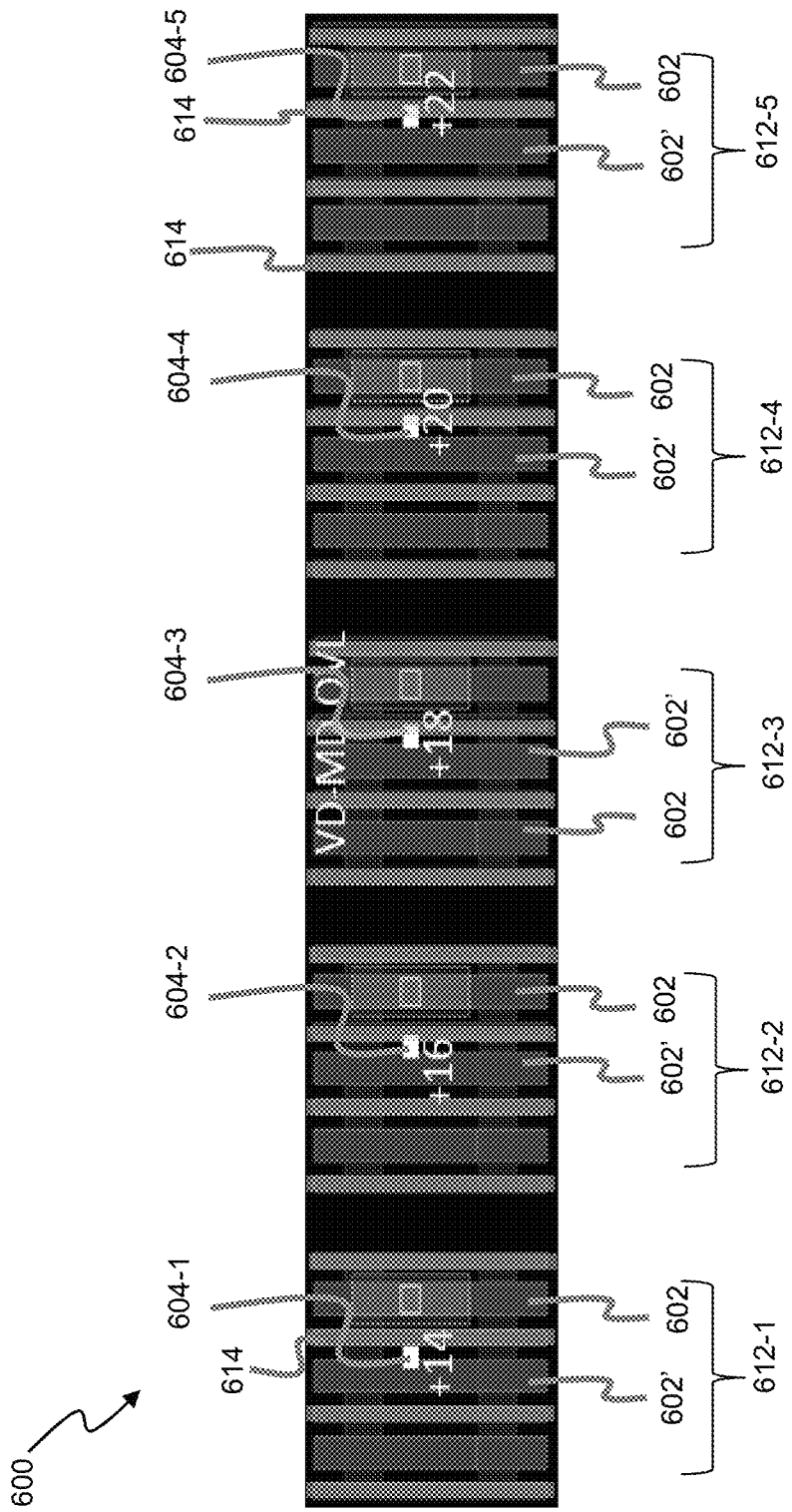
FIG. 6 illustrates an exemplary layout design which may incorporate overlay test pattern cells, in accordance with some embodiments.

Referring now to FIG. 6, shown therein is an example of overlay test pattern cells inserted into adjacent layers of an IC layout 600. The IC layout 600 includes multiple layers. In some embodiments represented in FIG. 6, the IC layout 600 includes a first overlay test pattern cell and a second overlay test pattern cell in two adjacent layers of the multiple layers of the IC layout 600. The first overlay test pattern cell includes a plurality of patterns 602 that are grouped in a plurality of groups 612. For the ease of reference, the layer in which the first overlay test pattern cell is inserted may be referred to as the first layer. The second overlay test pattern cell includes a plurality of patterns 604 (604-1, 604-2, 604-3, 604-4, and 604-5) in a layer directly over the first layer. For the ease of reference, the layer in which the second overlay test pattern cell resides is referred to as the second layer. Different from conventional overlay patterns used in Box-in-Box and µDBO that are inserted in scribe lines or scribe areas of a wafer, the first and second overlay test pattern cells resemble the functional cells that surround them, in terms of materials and dimensions, and can be inserted on numerous location across a wafer. In some implementations, the overlay test pattern cells of the present disclosure can be inserted into gaps among functional cells as well as scribe lines and scribe areas. In some other implementations, the overlay test pattern cells of the present disclosure are only inserted into gaps among functional cells such that the overlay test pattern cells of the present disclosure can be placed adjacent to functional cells, rather than farther away from them. Modern-day functional cells have dimensions measured by nanometer, way beyond the resolution of convention inspection techniques that utilize visible light that includes a smallest wavelength of about 380 nm. Once the pitch of a test pattern is reduced below one half of the smallest wavelength of visible lights, i.e. 190 nm, the conventional inspection techniques would fail. The inability to reduce to the pitch of test patterns below 195 nm prevents conventional test patterns from being placed or inserted in regular gaps surrounded by standard functional cells. It is not economical to intentionally enlarge gaps among functional cells to accommodate conventional test patterns, not to mention placing or inserting intentionally enlarged gaps across a wafer.

For example, as illustrated in FIG. 6, the plurality of patterns 602 of the first overlay test pattern cell resembles metal connections between source/drain features and metal lines. Such metal connections can be referred to as the "MD" features. The plurality of patterns 604 of the second overlay test pattern cell resembles via features, which can be referred to as the "VD" features. In some embodiments, both the plurality of patterns 602 and the plurality of patterns 604 can be conductive features formed of conductive materials, such as metal, metal oxide, metal nitride, metal oxynitride, silicide, doped dielectric material, doped compound semiconductor, doped semiconductor, and doped polysilicon. The resemblance of the overlay test pattern cells to the functional cells in terms of dimensions reduces the area requirement for overlay test patterns and allows more accurate overlay measure between layers. In some instances, the overlay test pattern cells of the present disclosure cannot be used to measured overlay using humanly visible light because the pitches of the overlay test pattern cells are smaller than the smallest wavelength on the full spectrum of humanly visible lights, which is about 380 nm, or in some cases, smaller than one half of the smallest humanly visible light wavelength, which is about 190 nm.

In some embodiments of the present disclosure, adjacent patterns 602 of the first overlay test pattern cell are evenly spaced and the groups 612 of the patterns 602 are placed at a first pitch. In some embodiments, to allow effective and accurate measurement of the overlay between the first layer and the second layer, the first overlay test pattern cell is different from the second overlay test pattern cell in terms of pitches, spacing and width. In the exemplary embodiment shown in FIG. 6, the plurality of patterns 604 of the second overlay test pattern cell includes a second pitch that is greater than the first pitch. The difference between the first pitch and the second pitch allows detection and quantification of the overlay misalignment. For example, in FIG. 6, the pattern 604-1 overlaps with the pattern 602' of the group 612-1 but the pattern 604-5 does not overlap with pattern 602' of the group 612-5. When the plurality of patterns 602 forms an array and the plurality of patterns 604 form another, the changes from total alignment and total misalignment between the patterns 602 and 604 provide information of how much the overlay is misaligned and in what direction the overlay is misaligned. To allow overlay measure using e-beam inspection, the first and second layers, along with the first and second overlay test pattern cells, are to be fabricated or formed as described in block 314 of the method 300 in FIG. 3.

In some embodiments, the IC layout 600 also includes polysilicon patterns 614 in the same layer (the first layer) with patterns 602. As shown in FIG. 6, the polysilicon patterns 614 have a uniform pitch and interpose the patterns 602 at each group 612. In the embodiment represented in FIG. 6, the patterns 604 have a center position or 0 position. A pattern of the patterns 604 that is 14 unit distances to the right of the 0 position is referred to the +14 position. Similarly, a pattern of the patterns 604 that is 14 unit distances to the left of the 0 position is referred to the −14 position. The unit distance can be fixed value, such as 5 nm, or a value defined relative to a width of the gate of a functional cell, such as a fraction of the gate width. As pattern 604 moves from the +14 position (pattern 604-1) to the +22 position (pattern 604-5), while the pattern 604 moves from partial overlap with the pattern 602' of group 612-1 to complete missing the pattern 602' of group 612-5, the pattern 604 also moves from complete missing the polysilicon pattern 614 of group 612-1 to partial overlap with the polysilicon pattern 614 of group 612-5. When the polysilicon patterns 614 are conductive in some embodiments, the overlap between the pattern 604-5 and the polysilicon pattern 614 of group 612-5 may also create a bright voltage contrast image when the formed overlay test patterns are subject to e-beam inspection.

Figure 7A:
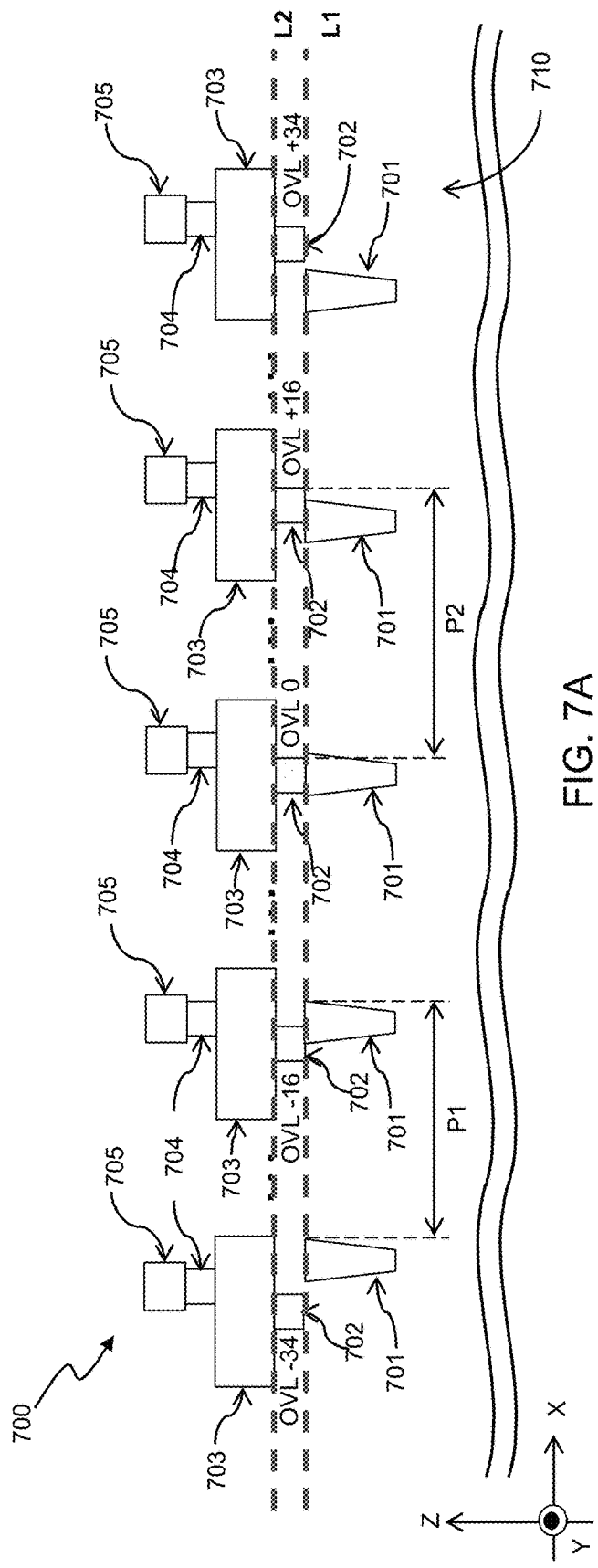
FIGS. 7A and 7B illustrate exemplary overlay test pattern cells fabricated in a semiconductor structure and a voltage contrast image thereof taken using electron beam (e-beam) inspection, in accordance with some embodiments.

FIG. 7A illustrates exemplary overlay test pattern cells formed in a semiconductor structure 700 and a voltage contrast image 750 taken using e-beam inspection, according various aspects of the present disclosure. In some instances, the semiconductor structure 700 includes a first overlay test pattern cell in a first layer L1 and a second overlay test pattern cell in a second layer L2 over the first layer L1. The first overlay test pattern cell includes an array of patterns 701 and the second overlay test pattern cell includes an array of patterns 702. In some embodiments, the first overlay test pattern cell as a whole and the second overlay test pattern cell as a whole extend along the X-direction and are substantially equal in dimension along the X direction. Each of the patterns in the first and second overlay test pattern cells extend along the Y-direction. In some other embodiments, the first overlay test pattern cell as a whole is greater in length than the second overlay test pattern cell as a whole along the X direction. In some implementations, the patterns 701 in the first overlay test pattern cell in the first layer L1 include a first pitch P1 and the patterns 702 in the second overlay test pattern cell in the second layer L2 include a second pitch P2 greater than the first pitch P1. In some implementations, each of the first and second overlay test pattern cells has odd number of patterns 701 and 702. When the pattern 701 in the middle of the first overlay test pattern cell and the pattern 702 in the middle of the second overlay test pattern cell are aligned at the position OVL 0, each of the first and second overlay test patterns has identical number of patterns 701 and 702 on either side of the middle patterns 701 and 702 at the position OVL 0. Because the second pitch P2 is greater than the first pitch P1, the misalignment of the overlay between patterns 701 and patterns 702 increases as the patterns move away from the middle position OVL 0 along the X direction. In the example shown in FIG. 7A, the patterns 701 and the patterns 702 at the OVL +16 and OVL −16 positions only partially overlap. At the OVL +34 and OVL −34 positions, the pattern 701 completely misses the pattern 702. As used herein, OVL+N denotes distance N along the X direction OVL−N denotes distance N along the —X direction. N can be a distance or the $N_{th}$ pattern counting from the middle-most pattern. In some embodiments as shown in FIG. 7A, the patterns 701 of the first overlay test pattern cell resemble MD features and the patterns 702 of the second overlay test pattern cell resemble VD features. In some implementations, the patterns 701 and the patterns 702 are formed of conductive materials such as metal, metal oxide, metal nitride, metal oxynitride, silicide, doped dielectric material, doped compound semiconductor, doped semiconductor, and doped polysilicon. In addition, in these implementations, the patterns 701 and the patterns 702 are interposed with dielectric or insulative materials, such as silicon oxide, silicon nitride, or silicon oxynitride.

In some embodiments, in addition to overlay test pattern cells extending along the X direction, such as those shown in FIG. 7A, a third overlay test pattern cell (not shown) that extends along the Y direction may be inserted in the first layer L1 and a fourth overlay test pattern cell (not shown) that also extends along the Y direction may be inserted in the second layer L2. After the third overlay test pattern cell and the fourth overlay test pattern cell are fabricated on a wafer or a substrate, the overlay along the Y direction can be measured by taking voltage contrast image of the third and fourth overlay test pattern cells using e-beam inspection.

The overlay of the first layer L1 and second layer L2, as fabricated, can be measured by e-beam inspection according to embodiments of the present disclosure. In some embodiments, a scanning electron microscope (SEM) can be used to measure the overlay and take voltage contrast image of the overlay test pattern cells. In these embodiments, an SEM can emit an electron beam (e-beam) at a spot on the wafer surface, the primary electrons (PE) of the electron beam can generate secondary electrons (SE) and back-scattered electrons (BSE). In some implementations, the SEM can take voltage contrast images. The brightness of the voltage contrast image is determined by the number of electrons captured by a detector of the SEM. The yield of the e-beam is a function of the energy of the PE, which can be referred to as the landing energy (LE). In some embodiments, the e-beam inspection of the overlay takes place in the LE range where the yield is greater than 1. That range can be referred to as the voltage contrast (VC) range for the purpose of the present disclosure. When the SEM operates in the VC range, the wafer surface is positively charged as more electrons leave the wafer surface than those arrive at the wafer surface. If a feature is positively charged and cannot dissipate the positive charge through electrical connection to the wafer, the feature appears darker in the voltage contrast image because the positive charge on the feature can build up and prevent electrons from leaving the surface of the feature to be captured by the detector. If another feature can dissipate the positive charge through electrical connection to the wafer substrate, that feature appears brighter as electrons can leave the surface to be detected.

In the exemplary embodiments shown in FIG. 7A, both of the patterns 701 and 702 are conductive and patterns 701 in the first layer L1 are coupled to the wafer below L1. That is, if a pattern 702, along with the structures thereon, is connected to a pattern 701 as a result of alignment with the pattern 701, positive charges on the this pattern 702 can dissipate and it will appear brighter. Conversely, if a pattern 702 is misaligned with the pattern 701 therebelow, this pattern 702 appears dark. The ability to dissipate positive charge can depend on the level of overlay. Square alignment between a pattern 702 and a pattern 701 along the Z direction allows for maximum positive charge dissipation or neutralization, resulting in relatively brighter image. Total misalignment between a pattern 702 and a pattern 701 along the Z-direction leads to the pattern 702 being in contact with the dielectric/insulative material interposed between patterns 701, resulting in dark image. Partial misalignment between a pattern 702 and a pattern 701 along the Z direction allows for some positive charge neutralization, resulting in a brightness that falls between the bright image and the dark image.

Figure 7B:
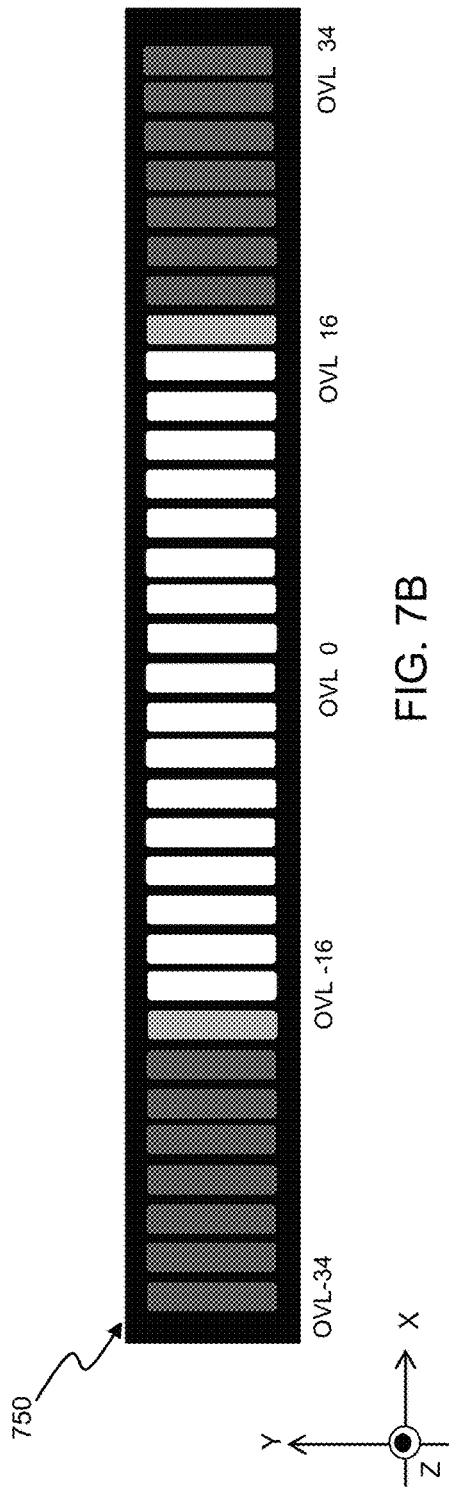

Reference is now made to FIG. 7B, which illustrates an exemplary voltage contrast image of the semiconductor structure 700. It is noted that the OVL 0, OVL 16, OVL 34, OVL −16, and OVL −34 positions in FIG. 7A correspond to OVL 0, OVL 16, OVL 34, OVL −16, and OVL −34 positions in FIG. 7B. At the OVL 0 position, because the pattern 702 of the second overlay test pattern cell is squarely aligned with the pattern 701 of the first overlay test pattern cell, the voltage contrast image at the OVL 0 position is the brightest, as shown in FIG. 7B. At the OVL 34 or the OVL −34 positions, because the pattern 702 is completely misaligned with the pattern 701 therebelow, the voltage contrast images at the OVL 34/OVL −34 positions appear dark. At the OVL 16 or the OVL −16 positions, because the pattern 702 is partially aligned with the pattern 701 therebelow, the brightness of the voltage contrast images at the OVL 16/OVL −16 positions falls between the brightness of the image at the OVL 0 position and the brightness of the images at the OVL 34/OVL −34 position. As used herein, OVL+N denotes distance N along the X direction OVL−N denotes distance N along the —X direction. N can be a unit distance or the $N_{th}$ pattern counting from the middle-most pattern at the OVL 0 position.

By having an array of patterns 701 in the first overlay test pattern cell and an array of patterns 702 in the second overlay test pattern cell, the voltage contrast image of the semiconductor structure can show how much the first layer L1 is misaligned with the second layer L2 and in which direction is the misalignment. In the exemplary voltage contrast image shown in FIG. 7B, a band of bright images (or brightness band, for short) between the OVL −16 position and the OVL 16 position is centered at the OVL 0 position. Such a brightness band indicates good overlay between the first layer L1 and the second layer L2. If, for example, the brightness band is shifted to the left and centered at the OVL−16 position, it can be determined that the overlay of the second layer L2 is shifted in the —X direction by a distance between OVL0 and OVL−16. The center point of a brightness band can be determined by identifying the borders of the brightness band. In some embodiments, the shifting of a brightness band, an amount of alignment, and a direction of overlay misalignment can be observed, analyzed and recorded by an operator. In some other embodiments, the shifting of a brightness band, an amount of alignment, and a direction of overlay misalignment can be observed, analyzed and recorded by a computing system or by an operator aided by a computing system. In those embodiments where a computing system is used, the computing system can be a specialized computer, a specialized handheld device, a general computer loaded with software program designed for e-beam inspection, or a general handheld device installed with applications designed for e-beam inspection.

The designs of overlay test pattern cells shown in FIGS. 6 and 7A are for illustration purposes only and should not be considered limiting in any way. The overlay measurement technique envisioned by the present disclosure is compatible with a variety of designs of overlay test pattern cells. In some embodiments, the array of patterns in the first overlay test pattern in a first layer has a first pitch and the array of patterns in the second overlay test pattern in a second layer over the first layer has a second pitch that is different from the first pitch. In instances where the second pitch is greater than the first pitch, the number of repeating patterns in the first layer is greater than the number of repeating patterns in the second layer; and in instances where the first pitch is greater than the second pitch, the number of repeating patterns in the second layer is greater than the number of repeating patterns in the first layer. In those instances, the first overlay test pattern cell and the second overlay test pattern cell are substantially of the same dimension along the direction of the array of patterns. In some embodiments, the first pitch and the second pitch include a difference between them and the difference bears a relationship with a width of a gate of the functional cells adjacent to or surrounding the overlay test pattern cells. The width of the gate of the neighboring functional cell can be referred to the gate width. In some implementations, the difference between the first and second pitches is about one-fourth (¼) to one-fortieth (¼₀) of the gate width. The number of patterns in first and second overlay test pattern cells can also bear a relationship with the difference between the first and second pitches. In some instances, when the gate width is X times of the difference between the first and second pitches, the number of patterns can be 1 to 2 times of X. In some implementations, each of the first and second overlay test pattern cells has 4 to 80 patterns in their arrays.

In some embodiments, the first overlay test pattern cell in the first layer includes a uniform pitch while patterns of the second overlay test pattern cell in the second layer over the first layer include increasing spacing for patterns away from the middle pattern, such as the pattern 702 at the OVL 0 position. In those embodiments, the separation between patterns in the second overlay test pattern cell increase from a starting value S to S plus a differential D (S+D) and then from S+D to S+2D, so on and so forth. In those embodiments, D can be about one-fourth (¼) to one-fortieth (¼₀) of the gate width. In other embodiments, the patterns in the first overlay test pattern cell include a uniform pitch and the patterns in the second overlay test pattern cell are positioned based on a known mathematic relationship. The mathematic relationship allows for overlay measurement by generating different brightness patterns (such as a brightness band or a brightness dash) when the formed first and second overlay test pattern cells are subject to e-beam inspection.

In some other embodiments, the first overlay test pattern cell in the first layer extends in a first direction and includes first groups of repeating patterns. The first overlay test pattern cell has a middle group that is centered along the first direction. In those embodiments, the first overlay test pattern has identical number of groups of repeating patterns on either side of the middle group and these identical number of groups are disposed at a first pitch. In those embodiments, the second overlay test pattern cell also extends in the first direction and includes second groups of repeating patterns. The second groups of repeating patterns also include a middle group that divides the second groups of repeating patterns in two even halves. The two halves of repeating patterns (of the second overlay test pattern cell) on either side of the middle group are disposed at a second pitch different from the first pitch.

It is noted that the dimensions, pitches, pitch differences, and arrangement of the overlay test pattern cells described above in conjunction with overlay test pattern cells extending along the X-direction apply equally in the embodiments where pairs of overlay test pattern cells extending along the Y-direction are inserted in the IC layout.

Figure 8:
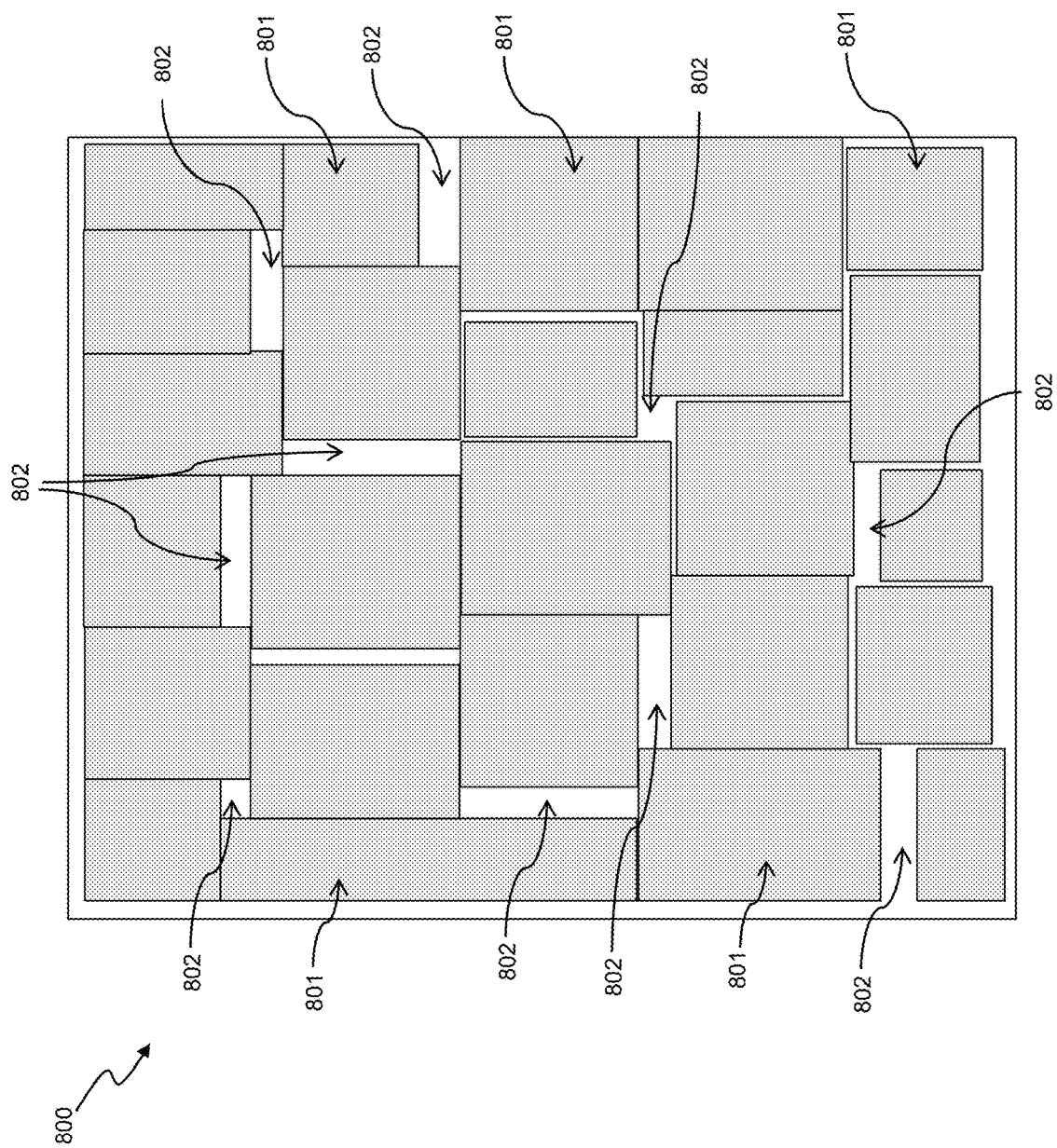
FIG. 8 illustrates a plurality of gaps among functional cell blocks that are available for insertion of overlay test patterns according to various aspects of the present disclosure.
Figure 9:
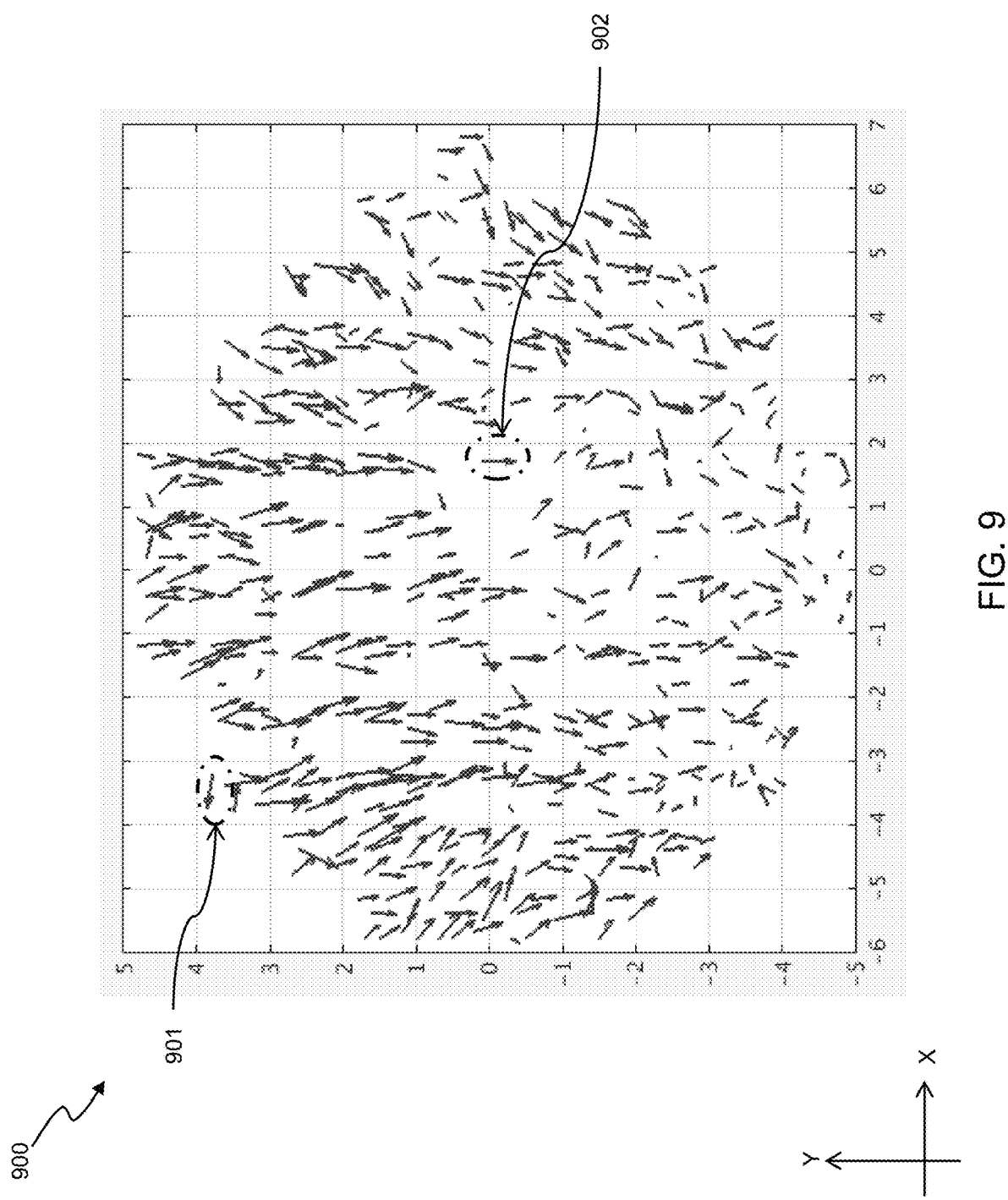
FIG. 9 is a diagram illustrating exemplary overlay measurements across a wafer, in accordance with some embodiments of the present disclosure.

Referring now to FIG. 8, shown therein is an IC layout 800. The IC layout 800 includes a plurality of functional cells 801. Because it is impossible to fill up the IC layout 800 with functional cells 801, the IC layout 800 also includes a plurality of gaps 802 among the functional cells 801. As described above in conjunction with FIGS. 3, 4A and 4B, overlay test pattern cells can be inserted into the gaps 802 or used to replace standard filler cells placed in the gaps 802. Because the overlay test pattern cells are smaller than conventional overlay patterns, they can be inserted into the IC layout 800 in larger numbers and well distributed across the IC layout 800. The increased number and better distribution of the overlay test pattern cells across the IC layout 800 enable large amount of overlay data. Overlay measurement data 900 across a wafer is illustrated in FIG. 9. Each pair of overlay test pattern cells (one in the first layer and the other in the second layer) can be used to generate a data point represented in FIG. 9 as a dot for good overlay or as a line for misalignment. In the data representation shown in FIG. 9, a line extending along the X direction, such as line 901, stands for misalignment along the X direction and a line extending along the Y direction, such as line 902, stands for misalignment along the Y direction. In addition, in some embodiments, the length of the line represents the amount of misalignment. Overlay data such as those shown in FIG. 9 can be provided to different department of the IC manufacturer for the purpose of quality control for the current lot or process improvement for future lots of products.

The embodiments of the present disclosure offer advantages over existing art, though it is understood that other embodiments may offer different advantages, not all advantages are necessarily discussed herein, and that no particular advantage is required for all embodiments. By use of the disclosed overlay test pattern cells that resemble functional cells in terms of dimensions and structure, the present disclosures allows for more accurate overlay measurement across the wafer without sacrificing chip utilization. The use of the disclosed overlay test pattern cells and e-beam inspection makes possible inline measurement and data acquisition, resulting in large throughput of overlay measurement data. The overlay measurement data can be analyzed for quality control of the current lot of products and for overlay improvement of future lots.

Thus, the present disclosure provides integrated circuits and methods for overlap measure are provided. In an embodiment, an integrated circuit includes a plurality of functional cells including at least one gap disposed adjacent to at least one functional cell of the plurality of functional cells and a first overlay test pattern cell disposed within the at least one gap, wherein the first overlay test pattern cell includes a first number of patterns disposed along a first direction at a first pitch. The first pitch is smaller than a smallest wavelength on a full spectrum of humanly visible lights.

In further embodiments, an integrated circuit includes a plurality of functional cells including at least one gap disposed adjacent to at least one functional cell of the plurality of functional cells, wherein each of the plurality of functional cells comprises a transistor; a first overlay test pattern cell disposed within the at least one gap, wherein the first overlay test pattern cell includes a first number of patterns disposed along a direction at a first pitch; and a second overlay test pattern cell disposed over the first overlay test pattern cell, wherein the second overlay test pattern cell includes a second number of patterns disposed along the direction at a second pitch different from the first pitch.

In yet further embodiments, a method of semiconductor device fabrication includes performing, by use of an integrated circuit (IC) design system, a placement process to assign locations of a plurality of functional cells on a chip; identifying, by use of the IC design system, at least one gap among the plurality of functional cells; and inserting, by use of the IC design system a first overlay test pattern cell within the at least one gap, wherein the first overlay test pattern cell includes a first number of patterns disposed along a first direction at a first pitch, wherein the first pitch is smaller than a smallest wavelength on a full spectrum of humanly visible lights.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    performing, by use of an integrated circuit (IC) design system, a placement process to assign locations of a plurality of functional cells on a chip to be fabricated on a wafer;
    identifying, by use of the IC design system, at least one gap among the plurality of functional cells;
    inserting, by use of the IC design system, a first overlay test pattern cell within the at least one gap, wherein the first overlay test pattern cell includes a first number of patterns disposed along a first direction at a first pitch, wherein the first pitch is smaller than a smallest wavelength on a full spectrum of humanly visible lights;
    prior to the inserting of the first overlay test pattern cell, inserting, by use of the IC design system, at least one standard filler cell in the at least one gap;
    prior to the inserting of the first overlay test pattern cell, identifying, by use of the IC design system, a standard filler cell out of the at least one standard filler cell within the at least one gap; and
    removing, by use of the IC design system, the identified standard filler cell from the at least one gap.

2. The method of claim 1, further comprising:
    forming the first overlay test pattern cell; and
    forming a second overlay test pattern cell directly over the first overlay test pattern cell along a direction normal to a top surface of the wafer, wherein the second overlay test pattern cell includes a second number of patterns disposed along the first direction at a second pitch different from the first pitch.

3. The method of claim 2,
    wherein the forming of the first overlay test pattern cell comprises forming the first number of patterns with a first conductive material and interposing the first number of patterns with a first dielectric material,
    wherein the forming of the second overlay test pattern cell comprises forming the second number of patterns with a second conductive material and interposing the second number of patterns with a second dielectric material.

4. The method of claim 3, wherein the first conductive material and the second conductive material comprise metal, metal oxide, metal nitride, metal oxynitride, silicide, doped dielectric material, doped compound semiconductor, doped semiconductor, or doped polysilicon.

5. The method of claim 2, further comprising:
    inspecting an overlay between the formed first overlay test pattern cell and the formed second overlay test pattern cell using an electron beam (e-Beam) inspection process.

6. The method of claim 5, wherein the inspecting of the overlay between the formed first overlay test pattern cell and the formed second overlay test pattern cell comprises taking a voltage contrast image of the formed first overlay test pattern cell and the formed second overlay test pattern cell.

7. A method, comprising:
    inserting, by use of an integrated circuit (IC) design system, a first overlay test pattern cell in an IC design layer, wherein the first overlay test pattern cell includes a first number of patterns disposed along a first direction at a first pitch, wherein the first pitch is smaller than a smallest wavelength on a full spectrum of humanly visible lights;
    forming the first overlay test pattern cell;
    after the forming of the first overlay test pattern cell, forming a second overlay test pattern cell directly over the first overlay test pattern cell, wherein the second overlay test pattern cell includes a second number of patterns disposed along the first direction at a second pitch different from the first pitch; and
    inspecting an overlay between the formed first overlay test pattern cell and the formed second overlay test pattern cell using an electron beam (e-Beam) inspection process.

8. The method of claim 7, further comprising:
    prior to the inserting of the first overlay test pattern cell, identifying, by use of the IC design system, at least one gap among a plurality of functional cells in the IC design layer,
    wherein the inserting comprises inserting the first overlay test pattern cell within the at least one gap.

9. The method of claim 7,
    wherein the IC design layer comprises at least one standard filler cell,
    wherein the inserting comprises replacing the at least one standard filler cell with the first overlay test pattern cell.

10. The method of claim 7,
    wherein the forming of the first overlay test pattern cell comprises forming the first number of patterns with a first conductive material and interposing the first number of patterns with a first dielectric material,
    wherein the forming of the second overlay test pattern cell comprises forming the second number of patterns with a second conductive material and interposing the second number of patterns with a second dielectric material.

11. The method of claim 10, wherein the first conductive material and the second conductive material comprise metal, metal oxide, metal nitride, metal oxynitride, silicide, doped dielectric material, doped compound semiconductor, doped semiconductor, or doped polysilicon.

12. The method of claim 7, wherein the inspecting of the overlay between the formed first overlay test pattern cell and the formed second overlay test pattern cell comprises taking a voltage contrast image of the formed first overlay test pattern cell and the formed second overlay test pattern cell.

13. The method of claim 12, wherein the taking of the voltage contrast image comprises use of a scanning electron microscope (SEM).

14. The method of claim 12, wherein the voltage contrast image is bright when a first pattern in the first overlay test pattern cell and a second pattern in the second overlay test pattern cell are at least partially aligned.

15. The method of claim 12, wherein the voltage contrast image is dark when a first pattern in the first overlay test pattern cell and a second pattern in the second overlay test pattern cell are completely misaligned.

16. The method of claim 7, wherein the IC design layer comprises a standard filler cell.

17. A method, comprising:
   inserting a first overlay test pattern cell in an IC design comprising a transistor, wherein the first overlay test pattern cell includes a first number of patterns disposed along a first direction at a first pitch, wherein the first pitch is smaller than a smallest wavelength on a full spectrum of humanly visible lights;
   forming the first overlay test pattern cell in a first layer of the IC design;
   after the forming of the first overlay test pattern cell, forming a second overlay test pattern cell in a second layer of the IC design, wherein the second layer is directly over the first layer, wherein the second overlay test pattern cell includes a second number of patterns disposed along the first direction at a second pitch different from the first pitch; and
   inspecting an overlay between the formed first overlay test pattern cell and the formed second overlay test pattern cell by taking a voltage contrast image of the formed first overlay test pattern cell and the formed second overlay test pattern cell.

18. The method of claim 17,
   wherein the first pitch and the second pitch comprise a difference,
   wherein the transistor comprises a gate having a gate width,
   wherein the difference falls within a range between about one-fortieth (1/40) and about one-fourth (1/4) of the gate width.

19. The method of claim 17, further comprising:
   prior to the inserting of the first overlay test pattern cell, identifying at least one gap among a plurality of functional cells in the first layer,
   wherein the inserting comprises inserting the first overlay test pattern cell within the at least one gap.

20. The method of claim 17,
   wherein the first layer of the IC design comprises at least one standard filler cell,
   wherein the inserting comprises replacing the at least one standard filler cell with the first overlay test pattern cell.

* * * * *